(12) United States Patent
Kim et al.

(10) Patent No.: US 8,093,615 B2
(45) Date of Patent: Jan. 10, 2012

(54) LIGHT EMITTING DIODE MODULE

(75) Inventors: Yu-sik Kim, Suwon-si (KR);
Hyung-kun Kim, Suwon-si (KR);
Cheol-soo Sone, Anyang-si (KR);
Jae-wook Jeong, Seoul (KR)

(73) Assignee: Samsung LED Co., Ltd., Suwon, Gyunggi-Do (KR)

( * ) Notice: Subject to any disclaimer, the term of this patent is extended or adjusted under 35 U.S.C. 154(b) by 822 days.

(21) Appl. No.: 11/513,221

(22) Filed: Aug. 31, 2006

(65) Prior Publication Data
US 2007/0176196 A1    Aug. 2, 2007

(30) Foreign Application Priority Data

Feb. 2, 2006  (KR) .................. 10-2006-0010179

(51) Int. Cl.
*H01L 33/00*    (2010.01)
(52) U.S. Cl. .............. 257/99; 257/95; 257/98; 257/100; 257/E33.072
(58) Field of Classification Search .............. 257/95, 257/98, 100, E33.072, 99
See application file for complete search history.

(56) References Cited

U.S. PATENT DOCUMENTS

| | | | | |
|---|---|---|---|---|
| 4,626,739 A | * | 12/1986 | Shmulovich | 313/469 |
| 5,998,045 A | * | 12/1999 | Chen et al. | 428/690 |
| 7,344,902 B2 | * | 3/2008 | Basin et al. | 438/27 |
| 2004/0104663 A1 | * | 6/2004 | Umeya et al. | 313/461 |
| 2004/0129945 A1 | * | 7/2004 | Uemura | 257/98 |
| 2005/0215164 A1 | * | 9/2005 | Mueller et al. | 445/24 |

FOREIGN PATENT DOCUMENTS

| | | |
|---|---|---|
| JP | 2005-294288 A | 10/2005 |
| JP | 2006-303038 A | 11/2006 |
| WO | 2004021461 | 3/2004 |

OTHER PUBLICATIONS

Office Action issued on Jul. 17, 2009 in corresponding Chinese Patent Application No. 200610121884.1.
Office Action, with translation, issued on Sep. 27, 2011, in corresponding Japanese Patent Application No. 2006-302728.

* cited by examiner

*Primary Examiner* — Kenneth Parker
*Assistant Examiner* — Dale E Page
(74) *Attorney, Agent, or Firm* — Buchanan Ingersoll & Rooney PC

(57) ABSTRACT

A light emitting diode module having improved luminous efficiency is provided. The light emitting diode module includes: a light emitting chip; a phosphor layer formed of phosphor materials emitting light having a wavelength longer than the light emitted from the light emitting chip using light emitted from the light emitting chip as an excitation source; and a reflection plate that is disposed between the light emitting chip and the phosphor layer and that reflects the light emitted by the phosphor layer.

4 Claims, 5 Drawing Sheets

LIGHT EMITTING DIODE MODULE

CROSS-REFERENCE TO RELATED PATENT APPLICATION

This application claims the benefit of Korean Patent Application No. 10-2006-0010179, filed on Feb. 2, 2006 in the Korean Intellectual Property Office, the disclosure of which is incorporated herein in its entirety by reference.

BACKGROUND OF THE DISCLOSURE

1. Field of the Disclosure

The present disclosure relates to a light emitting diode module, and more particularly, to a light emitting diode module with an improved structure providing an improved luminous efficiency for realizing white light or colored light while using a light emitting diode emitting blue or ultraviolet light and phosphor materials.

2. Description of the Related Art

A light emitting diode (LED) is formed of a light emitting source using compound semiconductors, such as GaAS, AlGaN, and AlGaAs, to generate various colors of light. LEDs can be easily manufactured and controlled compared to semiconductor lasers and have longer life spans than fluorescent lamps, and thus have replaced fluorescent lamps as the illumination light sources for next generation display devices. Recently, blue light emitting diodes and ultraviolet light emitting diodes which are produced using nitride materials and having excellent physical and chemical characteristics, have been introduced. In addition, as white light and other colors can be produced using blue or ultraviolet light emitting diodes together with phosphor materials, the application range of light emitting diodes has been enlarged.

LED modules using phosphor materials produce white light or other colors of light according to the principle that light emitted from the blue or ultraviolet light emitting diode and incident on the phosphor material transmits energy to the phosphor material, and thus light with a longer wavelength than incident light is emitted. For example, in a white light emitting diode module, photons of ultraviolet light emitted from the LED chip excite the phosphor material and thus a combination of red, green, and blue light or a combination of yellow and blue light is emitted from the excited phosphor material. The wavelengths of the visible light emitted from the phosphor material vary according to the composition of the phosphor material, and this combination of visible light appears as white light to human eyes.

FIG. 1 is a schematic view of a conventional LED module. Referring to FIG. 1, in the LED module, a light emitting chip 1 is disposed in a concave recess on a base 6, a first resin layer 3 is coated inside the base 6, and a second resin layer 4 and a third resin layer 5 are coated sequentially on top of the first resin layer 3.

However, in the configuration described above, the light extraction efficiency is low. Light extraction efficiency refers to the ratio of the amount of the light generated in the light emitting chips 1 to the amount of the light actually emitted from the LED module, and is directly related to the luminous efficiency, which denotes the illuminating performance of the LED module.

FIG. 2 illustrates the path of the light emitted by excited phosphor layers in the structure of the LED module of FIG. 1. Referring to FIG. 2, the light is emitted by the excited phosphor materials over 360°. Accordingly, light that is not fully emitted outward and is instead emitted in the downward direction of FIG. 2 is thus counted as loss resulting in a decrease in the luminous efficiency of the LED module.

SUMMARY OF THE DISCLOSURE

The present invention may provide a light emitting diode (LED) module with a structure having high luminous efficiency.

According to an aspect of the present invention, there may be provided a light emitting diode module comprising: a light emitting chip; a phosphor layer formed of phosphor materials emitting light having a longer wavelength than the light emitted from the light emitting chip using light emitted from the light emitting chip as an excitation source; and a reflection plate that is disposed between the light emitting chip and the phosphor layer, and that reflects the light emitted from the phosphor layer.

BRIEF DESCRIPTION OF THE DRAWINGS

The above and other features and advantages of the present invention are illustrated in detailed exemplary embodiments thereof with reference to the attached drawings in which.

DETAILED DESCRIPTION OF EXEMPLARY EMBODIMENTS

The present invention will now be described more fully with reference to the accompanying drawings, in which exemplary embodiments of the invention are shown.

Figure 1:
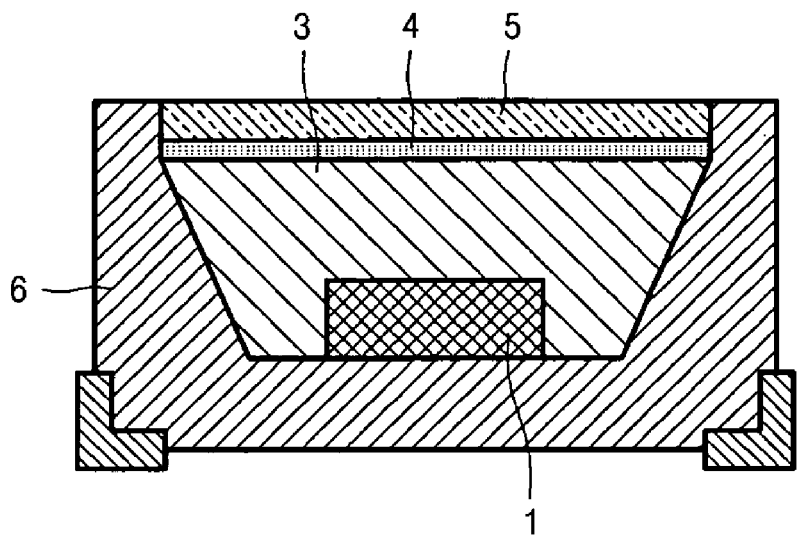
FIG. 1 is a cross-sectional view of a conventional light emitting diode (LED) module.
Figure 2:
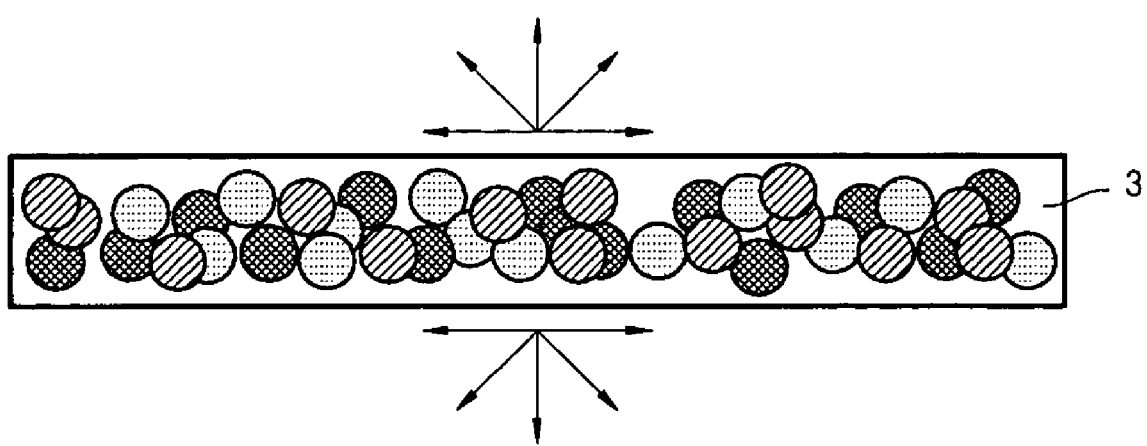
FIG. 2 is a schematic view illustrating directions of light emitted from a phosphor layer in the conventional LED module of FIG. 1.
Figure 3:
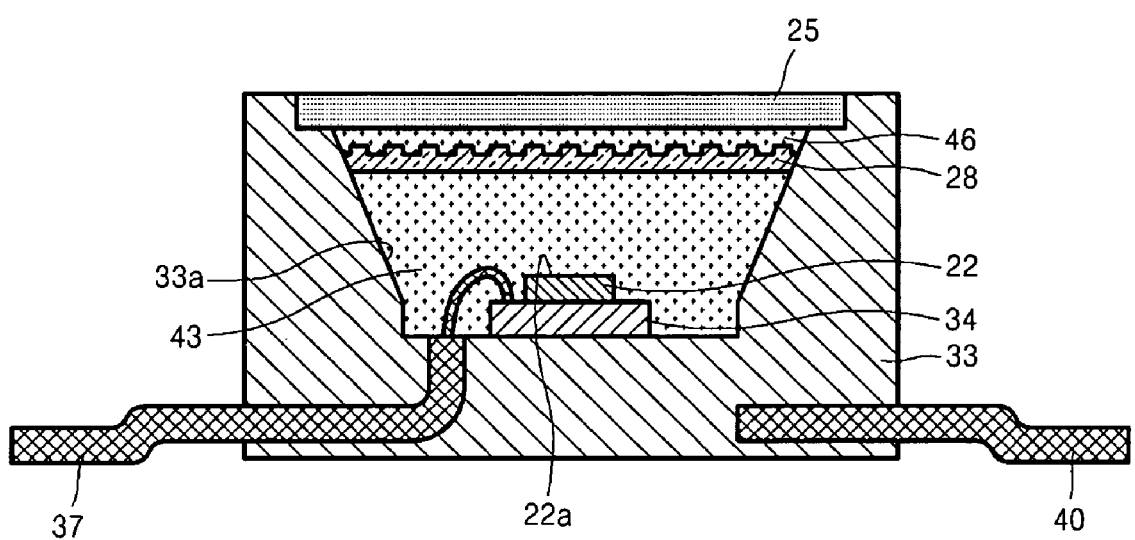
FIG. 3 is a cross-sectional view of an LED module according to an embodiment of the present invention.

FIG. 3 is a cross-sectional view of an LED module according to an embodiment of the present invention; and FIGS. 4A through 4D illustrate a number of reflection plates according to various embodiments of the present invention.

Referring to FIG. 3, the LED module includes a light emitting chip 22, a phosphor layer 25 using the light emitted from the light emitting chip 22 as an excitation source and emitting light of a longer wavelength than the light emitted from the light emitting chip 22, and a reflection plate 28 that is disposed between the phosphor layer 25 and the light emitting chip 22 and reflects the light emitted in the downward direction of FIG. 3 by the excited phosphor layer 25.

The light emitting chip 22 is disposed on a submount 34 that is mounted in a dispensing member 33 having a cup-shaped inner surface 33a. A first lead frame 37 and a second lead frame 40 are fixed in the lower portion of the dispensing member 33 and protrude from the dispensing member 33.

The first lead frame 37 and the second lead frame 40 are electrically connected to an n-electrode and a p-electrode of the light emitting chip 22 respectively.

The light emitting chip 22 includes a p-type semiconductor layer and an n-type semiconductor layer. When power is supplied through the first and second lead frames 37 and 40 between the n-electrode and the p-electrode, holes of the p-type semiconductor layer and electrons of the n-type semiconductor layer are combined in an active layer and thus light is generated Light is therefore emitted from the light emitting chip 22.

The wavelength of light generated in the light emitting chip 22 is determined according to the material and structure of the active layer, and according to the wavelength of light that is to be realized by the LED module.

The light generated and emitted by the light emitting chip 22 is transmitted through the reflection plate 28 and is incident on the phosphor layer 25 formed of a phosphor material. The incident light transmits energy to and excites the phosphor material, thereby changing the color of the light. Essentially, white light or other colors of monochromic light can be produced by the proper combination of the light emitting chip 22 and the phosphor layer 25 in the LED module.

For example, in one method of realizing white light, the light emitting chip 22 generates blue light, and the phosphor layer 25 is formed of a yellow phosphor material. Alternatively, the light emitting chip 22 generates ultraviolet light, and the phosphor layer 25 is formed of a mixture of red, green, and blue phosphor materials.

Also, the light emitting chip 22 can generate ultraviolet or blue light, and the phosphor layer 25 can be formed of a single color phosphor material such that an LED module emitting light of a single color having a longer wavelength than the light generated in the light emitting chip 22 can be produced.

The reflection plate 28 is disposed between the light emitting chip 22 and the phosphor layer 25, and a concavo-convex pattern is formed on the upper surface of the reflection plate 28 facing the phosphor layer 25.

Figure 4A:
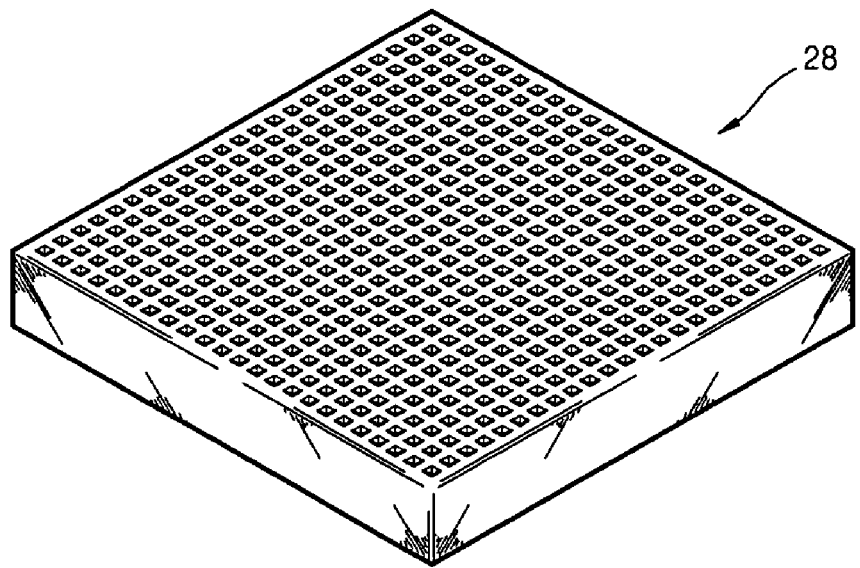
FIGS. 4A through 4D are perspective views illustrating reflection plates according to various embodiments of the present invention.
Figure 4B:
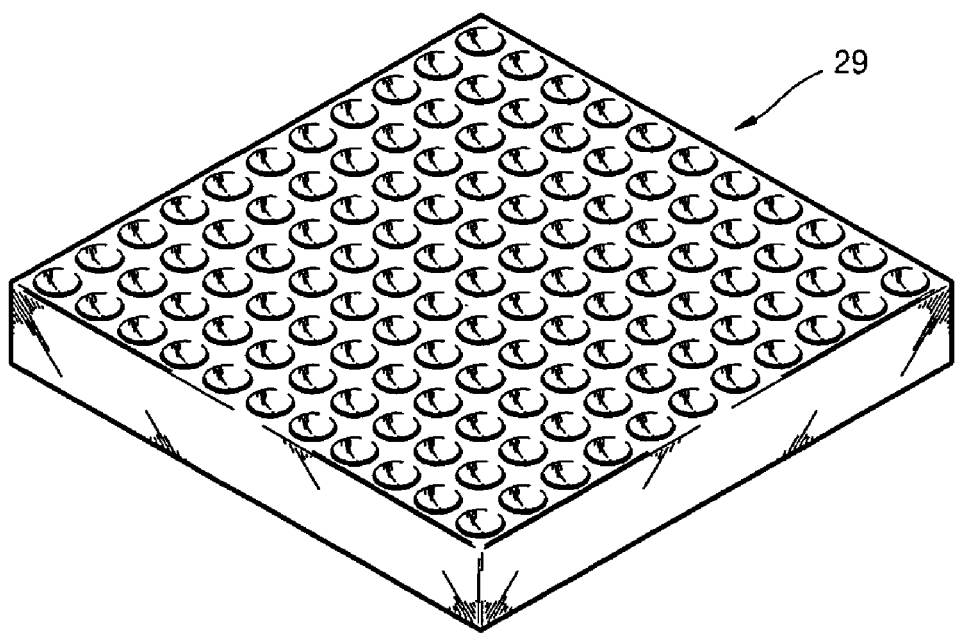

Referring to FIG. 4A, the concavo-convex pattern is a pattern of concave rectangular cavities. The concavo-convex pattern of FIG. 4 is illustrated as an example, and the pattern may be convex or have other forms. For example, as illustrated in FIG. 4B, a reflection plate 29 with a concavo-convex pattern of concave hemispheres can be employed. The concave-convex pattern in a preferred embodiment can be a hemispherical array or a polygonal cavity array.

The concavo-convex pattern may be formed on the upper surface of the reflection plate 28 or 29 facing the phosphor layer or on the lower surface of the reflection plate 28 or 29 facing the light emitting chip 22.

A first resin layer 43 may be formed between the light emitting chip 22 and the reflection plate 28 or 29. The first resin layer 43 protects the light emitting chip 22 and reduces the difference between the refractive index of the light emitting chip 22 and the refractive index of the region into which the light is emitted from the light emitting chip 22. As the refractive index of the first resin layer 43 is similar to the refractive index of the light emitting chip 22, the amount of the light that is totally internally reflected at a boundary surface 22a of the light emitting chip 22 is decreased, thus increasing the amount of the light that is emitted out of the light emitting chip 22.

A second resin layer 46 may be included between the reflection plate 28 or 29 and the phosphor layer 25.

Some light may be internally totally reflected at a surface where a concavo-convex pattern is not formed depending on the incidence angle, which may reduce the amount of light emitted from the LED module and thus reduce the luminous efficiency. Accordingly, when a concavo-convex pattern is formed only on the upper surface of the reflection plate 28 or 29 facing the phosphor layer 25 and the lower surface of the reflection plate 28 or 29 facing the light emitting chip 22 is flat, the refractive index of the first resin layer 43 may preferably be smaller than the refractive index of the reflection plate 28 or 29.

Also, when a concavo-convex pattern is formed only on the lower surface of the reflection plate 28 or 29 facing the light emitting chip 22 and the surface of the reflection plate 28 or 29 facing the phosphor layer 25 is flat, the refractive index of the second resin layer 46 may preferably be greater than the refractive index of the reflection plate 28 or 29.

Figure 4C:
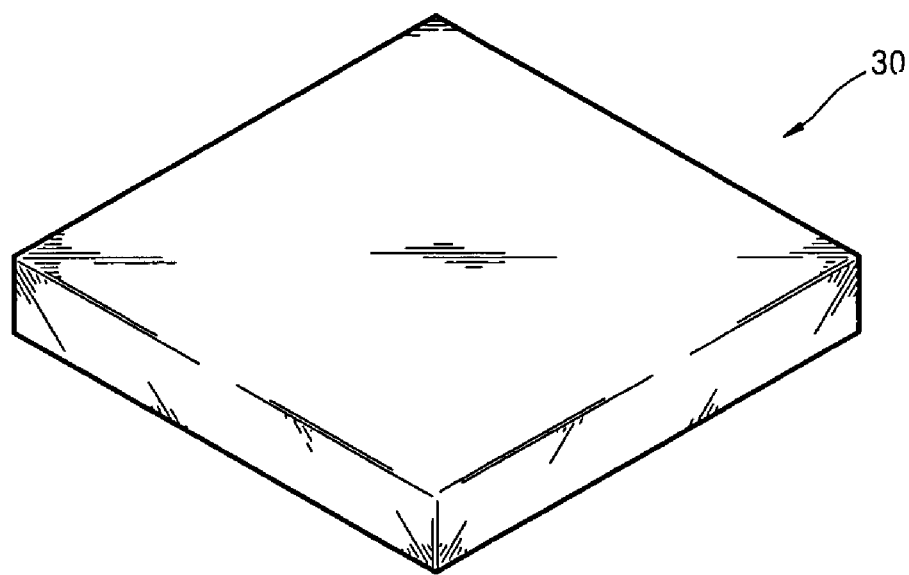

Referring to FIG. 4C, a reflection plate 30 may have a flat upper surface facing the phosphor layer 25 and a flat lower surface facing the light emitting chip 22. In this case, the refractive index of the first resin layer 43 may be smaller than the refractive index of the reflection plate 30, and the refractive index of the second resin layer 46 may be greater than the refractive index of the reflection plate 30 in order to reduce the loss of the light emitted from the light emitting chip 22 due to total internal reflection of some of the light at two boundary surfaces of the reflection plate 30. Also, this relatively higher refractive index of the second resin layer 46 is preferable in consideration of the light emitted from the excited phosphor layer 25 since the amount of the light that is reflected back towards the phosphor layer 25 by the reflection plate 30 increases.

Figure 4D:
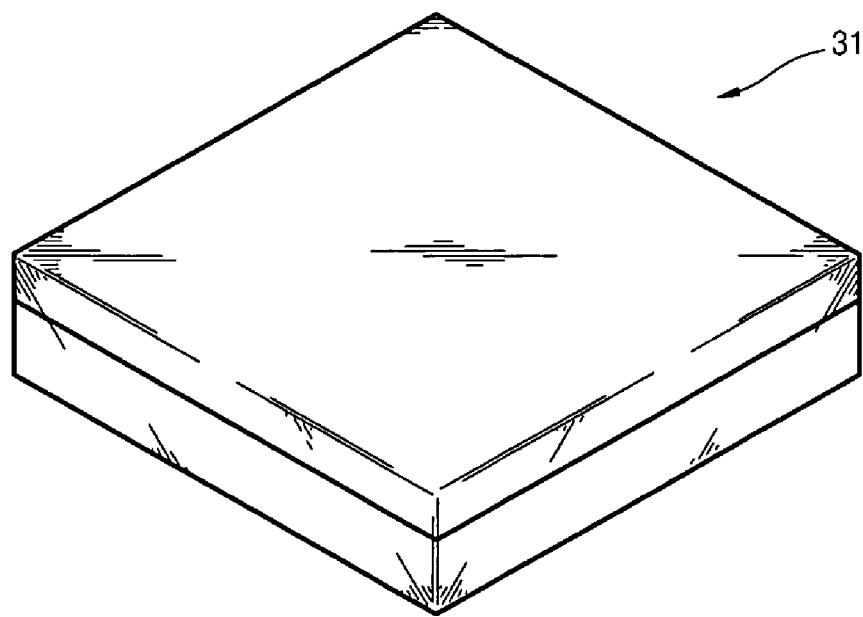

Referring to FIG. 4D, a reflection plate 31 may be formed of multiple layers of different materials having different refractive indices. In this instance, the refractive index of the layer that is disposed closer to the phosphor layer 25 may preferably be greater. Thus, as described above, for the light emitted from the light emitting chip 22 and transmitted through the reflection plate 31 and through the phosphor layer and emitted from the LED module, the loss due to the total internal reflection is minimized and for the light emitted from the phosphor layer 25, the amount of light that is reflected back toward the phosphor layer 25 is increased.

Figure 5:
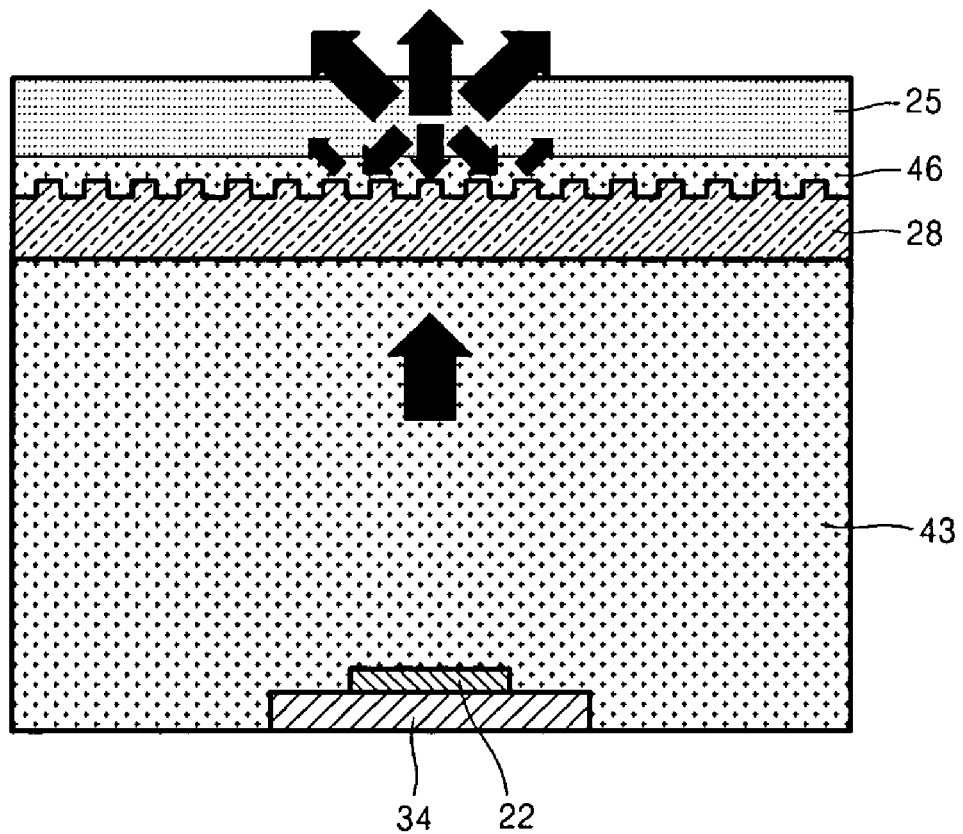
FIG. 5 is a schematic view illustrating light that is emitted from the phosphor layer of the LED module of FIG. 3.

FIG. 5 is a schematic view illustrating the light emitted from the light emitting chip 22 and the light emitted from the excited phosphor layer 25. Referring to FIG. 5, the light emitted from the light emitting chip 22 is transmitted through the reflection plate 28 and is incident on the phosphor layer 25.

The light incident on the phosphor layer 25 transmits energy to the phosphor materials, and consequently light having a longer wavelength than the incident light is emitted. The light is emitted in all directions above and below the phosphor layer 25. The reflection plate 28, disposed between the phosphor layer 25 and the light emitting chip 22, reflects the light which is not emitted from the LED module by the phosphor layer 25 but which is incident on the reflection plate 28 back towards the phosphor layer 25, thereby increasing the luminous efficiency.

Also, the concavo-convex pattern formed on the reflection plate 28 effectively diverges the light emitted by the phosphor layer 25 so as to emit the light from the LED module, which is preferred. The material forming the reflection plate 28, or the size and arrangement periods of the cavities of the concavo-convex pattern may be determined according to the wavelength of the light emitted from the light emitting chip 22 and the wavelength of the light emitted from the phosphor layer 25 or other related properties.

Examples of materials which can form the reflection plates 28 through 31 are $SiO_2$, $Al_2O_3$, AlN, and ZnSe.

Table 1 shows a comparison between the illumination efficiency of an LED module according to an embodiment of the present invention and the illumination efficiency of a conventional LED module.

TABLE 1

| | Current (A) | Power (W) | Brightness (lm) | Illumination Efficiency (lm/W) |
|---|---|---|---|---|
| Present Embodiment | 0.35 | 0.151 | 32.96 | 26.6 |
| Comparative Example | 0.35 | 0.097 | 27.99 | 22.7 |

The LED modules used to obtain these results included a light emitting chip emitting light of a wavelength of around 400 nm and a phosphor layer formed of a mixture of red, green, and blue phosphor materials. The first and second resin layers were formed of silicon resin, and the concavo-convex pattern of the reflection plate was the same as the pattern of FIG. 4B. The light emitted from the light emitting chip was incident on the phosphor layer and excited the phosphors to emit red, blue, and green light, which were used to realize white light.

Luminous efficiency is used as an index denoting the illuminating performance of the LED module, which refers to the brightness sensed by a human eye per watt of supplied power, the brightness being measured in units of lumens (lm). The luminous efficiency of the LED module according to the present embodiment was 26.6 lm/W and the luminous efficiency of the conventional LED module was 22.7 lm/W. Thus the LED module according to the present embodiment had a luminous efficiency that was 17% higher than the luminous efficiency of the conventional LED module.

In the LED module described above according to the present invention, a reflection plate reflecting the light emitted from the phosphor layer between the phosphor layer and the light emitting chip is used to improve the luminous efficiency of an LED module for realizing white light or single color light using a light emitting chip and a phosphor layer. Also, a fine concavo-convex pattern is formed on at least one surface of the reflection plate to increase the luminous efficiency.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light emitting diode module comprising:
a light emitting chip;
a phosphor layer formed of phosphor materials emitting light having a longer wavelength than that of light emitted from the light emitting chip using light emitted from the light emitting chip as an excitation source; and
a reflection plate that is disposed between the light emitting chip and the phosphor layer, and that reflects light, emitted from the phosphor layer by the transmission of light through a substance of the reflection plate, the reflection plate allowing light emitted from the light emitting chip, to be transmitted through the reflection plate by the transmission of light through a substance of the reflection plate; and
wherein a concavo-convex pattern is formed on the surface of the reflection plate which faces the phosphor layer.

2. The light emitting diode module of claim 1, wherein the concavo-convex pattern is a hemispherical array or a polygonal cavity array.

3. The light emitting diode module of claim 1, further comprising a first resin layer that has a refractive index smaller than the refractive index of the reflection plate and is formed between the reflection plate and the light emitting chip.

4. The light emitting diode module of claim 1, wherein the reflection plate is formed of a material selected from the group consisting of $SiO_2$, $Al_2O_3$, AlN, and ZnSe.

* * * * *